US011955373B2

(12) United States Patent
Ou et al.

(10) Patent No.: US 11,955,373 B2
(45) Date of Patent: Apr. 9, 2024

(54) GALLIUM OXIDE SEMICONDUCTOR STRUCTURE AND PREPARATION METHOD THEREFOR

(71) Applicant: Shanghai Institute of MicroSystem and Information Technology, Chinese Academy of Sciences, Shanghai (CN)

(72) Inventors: Xin Ou, Shanghai (CN); Tiangui You, Shanghai (CN); Wenhui Xu, Shanghai (CN); Pengcheng Zheng, Shanghai (CN); Kai Huang, Shanghai (CN); Xi Wang, Shanghai (CN)

(73) Assignee: Shanghai Institute of Microsystem And Information Technology, Chinese Academy of Sciences, Shanghai (CN)

( * ) Notice: Subject to any disclaimer, the term of this patent is extended or adjusted under 35 U.S.C. 154(b) by 180 days.

(21) Appl. No.: 17/290,395

(22) PCT Filed: Sep. 29, 2019

(86) PCT No.: PCT/CN2019/108854
§ 371 (c)(1),
(2) Date: Apr. 30, 2021

(87) PCT Pub. No.: WO2020/098401
PCT Pub. Date: May 22, 2020

(65) Prior Publication Data
US 2021/0384069 A1 Dec. 9, 2021

(30) Foreign Application Priority Data
Nov. 15, 2018 (CN) .......................... 201811359791.1

(51) Int. Cl.
*H01L 21/762* (2006.01)
*H01L 29/24* (2006.01)

(52) U.S. Cl.
CPC ........ *H01L 21/76254* (2013.01); *H01L 29/24* (2013.01)

(58) Field of Classification Search
CPC .............. H01L 21/76254; H01L 29/24; H01L 21/02002; H01L 21/2007; H01L 21/02008; H01L 21/02694
See application file for complete search history.

(56) References Cited

U.S. PATENT DOCUMENTS

| 6,251,754 B1 * | 6/2001 | Ohshima ........... H01L 21/76254 438/506 |
| 2006/0150891 A1 * | 7/2006 | Ichinose ................. H01L 33/26 117/2 |
| 2011/0171812 A1 * | 7/2011 | Letertre ................ H01L 21/185 257/E21.211 |

FOREIGN PATENT DOCUMENTS

| CN | 102945795 A | 2/2013 | |
| CN | 103021814 A * | 4/2013 | ............. H01L 21/02 |

(Continued)

OTHER PUBLICATIONS

Machine translation of CN-107039245-A, 2017.*
Machine translation of CN-103021814-A, 2013.*
Machine translation of CN-105957831-A, 2016.*

*Primary Examiner* — Suberr L Chi
*Assistant Examiner* — Carnell Hunter, III
(74) *Attorney, Agent, or Firm* — Boyle Fredrickson, S.C.

(57) ABSTRACT

The present invention provides a method for preparing a gallium oxide semiconductor structure and a gallium oxide semiconductor structure obtained thereby. The method comprises: providing a gallium oxide single-crystal wafer (1) having an implantation surface (1a) (S1); performing an ion implantation from the implantation surface (1a) into the gallium oxide single-crystal wafer (1), such that implanted ions reach a preset depth and an implantation defect layer (Continued)

(11) is formed at the preset depth (S2); bonding the implantation surface (1a) to a high thermal conductivity substrate (2) to obtain a first composite structure (S3); performing an annealing treatment on the first composite structure such that the gallium oxide single-crystal wafer (1) in the first composite structure is peeled off along the implantation defect layer (11), thereby obtaining a second composite structure and a third composite structure (S4); and performing a surface treatment on the second composite structure to remove a first damaged layer (111), so as to obtain a gallium oxide semiconductor structure comprising a first gallium oxide layer (12) and the high thermal conductivity substrate (2) (S5). In the gallium oxide semiconductor structure formed using the above method, the first gallium oxide layer (12) is integrated with the high thermal conductivity substrate (2) to effectively improve the thermal conductivity of the first gallium oxide layer (12).

10 Claims, 2 Drawing Sheets

(56) References Cited

FOREIGN PATENT DOCUMENTS

| CN | 103021814 | A | | 4/2013 | |
|----|-----------|---|---|--------|---|
| CN | 105374664 | A | | 3/2016 | |
| CN | 105895576 | A | | 8/2016 | |
| CN | 105957831 | A | * | 9/2016 | ........... H01L 21/265 |
| CN | 107039245 | A | * | 8/2017 | ....... H01L 21/02565 |
| CN | 107039245 | A | | 8/2017 | |
| CN | 109671612 | A | | 4/2019 | |
| JP | 2014199939 | A | | 10/2014 | |

* cited by examiner

GALLIUM OXIDE SEMICONDUCTOR STRUCTURE AND PREPARATION METHOD THEREFOR

This application is a 371 of international PCT/CN2019/108854, filed Sep. 29, 2019, which claims priority to CN Patent Application No. 201811359791.1, filed on Nov. 15, 2018, the contents of each of which are hereby incorporated by reference.

FIELD OF THE INVENTION

The present invention relates to semiconductor materials, and more particularly to a gallium oxide semiconductor structure and a preparation method therefor.

BACKGROUND OF THE INVENTION

With the rapid development of the electronic information industry, a demand for semiconductors is no longer limited to traditional semiconductor materials and technologies. It has evolved from semiconductor silicon-based materials to second-generation semiconductors represented by gallium arsenide and indium phosphide. It is gradually shifting to the third-generation wide-bandgap semiconductor materials.

The third-generation wide-bandgap semiconductor materials (bandgap width Eg>2.3 eV) comprise silicon carbide (SiC), zinc oxide, gallium nitride, diamond, gallium oxide, etc. Due to its advantages, such as high breakdown voltage resistance, large electron mobility, good thermal stability and strong anti-radiation ability, the third-generation wide-bandgap semiconductor material is increasingly being used in high-frequency, high-power, and highly integrated optoelectronic devices. In particular, due to its wider-bandgap of 4.5 eV~4.9 eV (more than 4 times of Si), much higher than 3.24 eV of zinc oxide and 3.4 eV of gallium nitride, the gallium oxide material can be widely used in the blue-violet light or ultraviolet light-emitting devices and deep ultraviolet detectors. On the other hand, Baliga's figure of merit of gallium oxide (relative to silicon) is up to 3444, which is about 10 times of SiC and 4 times of GaN. Therefore, devices based on gallium oxide will have smaller conduction loss and higher power conversion efficiency, and have huge application potential in the fields of power electronics and power devices in the future.

In recent years, the research on gallium oxide crystal materials has made relatively great progress. 2 inch and 4-6 inch Gallium oxide wafers have been prepared via the Czochralski method and the Edge-defined Film-fed Growth method in Germany and Japan, respectively. In 2015, 2 inch β-gallium oxide wafers have been commercialized in Japan. In China, explorations on the crystallization habits, doping methods and optical properties of gallium oxide have been carried out by the Shanghai Institute of Optics and Fine Mechanics of Chinese Academy of Sciences, Tongji University, CETC 46, Shandong University and etc. However, the thermal conductivity of the gallium oxide crystal material is very low (about 0.27 W·cm$^{-1}$·K$^{-1}$). If the device is directly prepared on the bulk gallium oxide wafers, the heat dissipation will become the main bottleneck restricting the performance of the device. The integration of gallium oxide thin film device with high thermal conductivity substrate is the main way to solve the heat dissipation problem, e.g., integrating $Ga_2O_3$ thin film on a silicon-based substrate (the thermal conductivity of a silicon substrate is 5.6 times of $Ga_2O_3$) to form a $Ga_2O_3$ on insulator (GaOOI) structure. Due to the lack of matching substrate materials, there are many challenges to epitaxially grow high-quality gallium oxide single-crystal films on high thermal conductivity substrates by the traditional epitaxial growth techniques (such as molecular beam epitaxy, metal organic chemical vapor deposition, magnetron sputtering, etc.). In addition, the epitaxial buffer layer required for epitaxial growth affects the performance and lifetime of the device.

SUMMARY OF THE INVENTION

In order to solve the above-mentioned problem in the prior art that a gallium oxide single-crystal film cannot be epitaxially grown on a high thermal conductivity substrate, the present invention provides a gallium oxide semiconductor structure and a preparation method therefor.

The present invention provides a method for preparing a gallium oxide semiconductor structure, comprising following steps: S1, providing a gallium oxide single-crystal wafer having an implantation surface; S2, performing an ion implantation from the implantation surface into the gallium oxide single-crystal wafer, such that implanted ions reach a preset depth and an implantation defect layer is formed at the preset depth, and a first gallium oxide layer and a second gallium oxide layer are formed on opposite sides of the implantation defect layer; S3, bonding the implantation surface to a high thermal conductivity substrate to obtain a first composite structure including the gallium oxide single-crystal wafer and the high thermal conductivity substrate; S4, performing an annealing treatment on the first composite structure such that the gallium oxide single-crystal wafer in the first composite structure is peeled off along the implantation defect layer, thereby obtaining a second composite structure and a third composite structure, wherein the implantation defect layer forms a first damaged layer and a second damaged layer, the second composite structure includes the first damaged layer, the first gallium oxide layer and the high thermal conductivity substrate, and the third composite structure includes the second damaged layer and the second gallium oxide layer; S5, performing a surface treatment on the second composite structure to remove the first damaged layer, so as to obtain a gallium oxide semiconductor structure comprising the first gallium oxide layer and the high thermal conductivity substrate.

The gallium oxide single-crystal wafer is α-type gallium oxide single-crystal wafer or β-type gallium oxide single-crystal wafer.

The gallium oxide single-crystal wafer is intrinsic gallium oxide single-crystal wafer or doped gallium oxide single-crystal wafer. Preferably, the doped gallium oxide single-crystal wafer is Sn-doped gallium oxide single-crystal wafer.

The gallium oxide single-crystal wafer has a crystal orientation of (−201), (010), (001) or (100).

The size of the gallium oxide single-crystal wafer is a millimeter-level wafer or a wafer-level wafer.

In the step S2, H ions and/or He ions are implanted from the implantation surface.

The preset depth is 20 nm~20 μm. Preferably, the preset depth is 100 nm 900 nm. More preferably, the preset depth is 200 nm~300 nm. In a preferred embodiment, the preset depth is 230 nm.

The energy of the ion implantation is 5 keV~1000 keV, the dose is $1\times10^{16}$ ions/cm$^2$6×10$^{17}$ ions/cm$^2$, and the temperature is −20° C.~300° C.

The high thermal conductivity substrate is a substrate or a composite substrate of at least two substrates selected from the group consisting of a silicon substrate, a silicon oxide substrate, a diamond substrate, an aluminum nitride substrate, and a silicon carbide substrate.

In the step S3, the implantation surface and the high thermal conductivity substrate are bonded via direct bonding, dielectric layer bonding, metal bonding or anodic bonding.

In the step S4, the annealing treatment is carried out in a vacuum environment or in a protective atmosphere formed by at least one of nitrogen, oxygen and inert gas, the annealing temperature is 50° C.~700° C., and the annealing time is 1 min to 24 h.

In the step S5, the surface treatment is at least one treatment process selected from the group consisting of chemical mechanical polishing, chemical etching, plasma etching, and low energy ion sputtering.

The method further comprises performing a surface treatment on the third composite structure to remove the second damaged layer to obtain the second gallium oxide layer. The second gallium oxide layer can be recycled to reduce the cost.

The present invention also provides a gallium oxide semiconductor structure, wherein the gallium oxide semiconductor structure is obtained according to above method.

According to the preparation method of the present invention, the implantation defect layer is formed at the preset depth under the implantation surface by the ion implantation, and then bonded with the high thermal conductivity substrate, and the bonded structure is annealed, so that the thinner first gallium oxide layer (i.e., gallium oxide single-crystal film) is transferred to the high thermal conductivity substrate to form the gallium oxide semiconductor structure. In the gallium oxide semiconductor structure, the gallium oxide single-crystal film is integrated with the high thermal conductivity substrate to effectively improve the thermal conductivity of the gallium oxide single-crystal film. In addition, the remaining thicker second gallium oxide layer can be recycled to reduce the production cost of the gallium oxide single-crystal film.

DESCRIPTION OF THE PREFERRED EMBODIMENTS

The preferred embodiments of the present invention are described in detail below in conjunction with the accompanying drawings.

Figure 1:
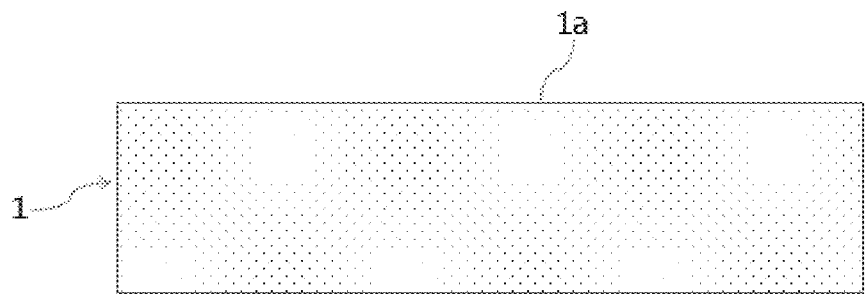
FIG. 1 is a sectional view of the gallium oxide single-crystal wafer before the implantation provided by the method for preparing the gallium oxide semiconductor structure according to the present invention.
Figure 2:
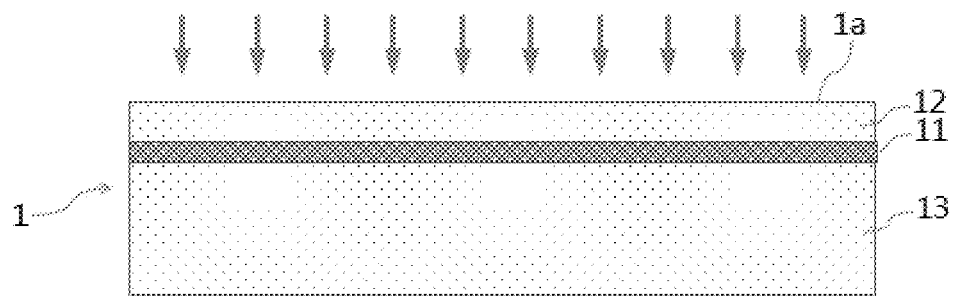
FIG. 2 is a sectional view of the gallium oxide single-crystal wafer after the implantation provided by the method for preparing the gallium oxide semiconductor structure according to the present invention.
Figure 3:
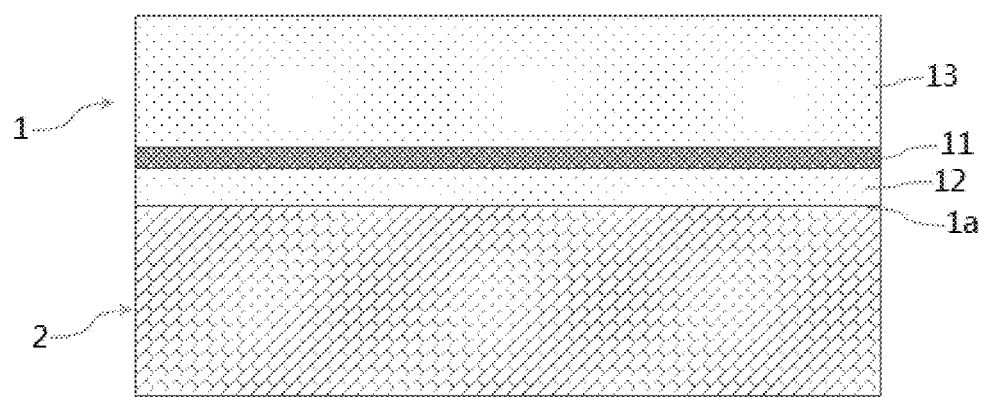
FIG. 3 is a sectional view of the first composite structure obtained by bonding the gallium oxide single-crystal wafer after the implantation and the high thermal conductivity substrate provided by the method for preparing the gallium oxide semiconductor structure according to the present invention.
Figure 4:
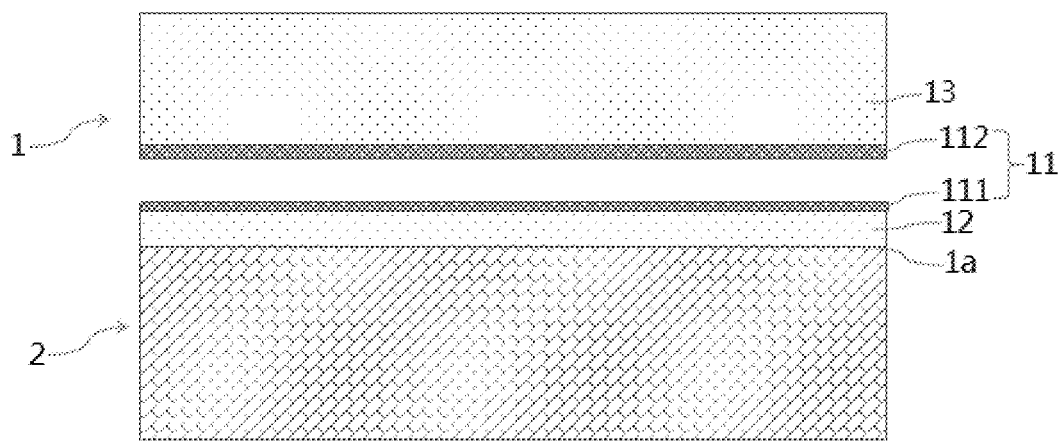
FIG. 4 is a sectional view of the peeling of the first composite structure off along the implantation defect layer provided by the method for preparing the gallium oxide semiconductor structure according to the present invention.
Figure 5:
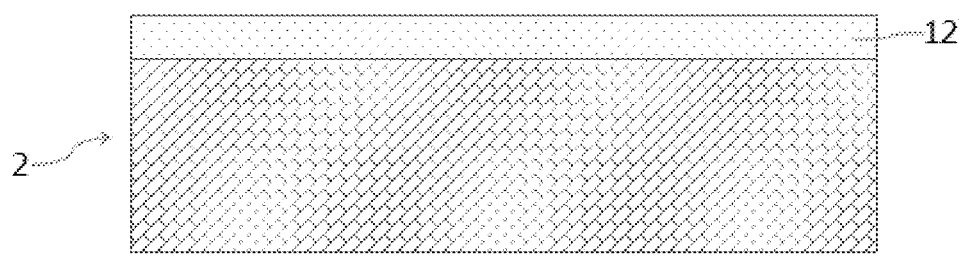
FIG. 5 is a sectional view of the gallium oxide semiconductor structure provided by the method for preparing the gallium oxide semiconductor structure according to the present invention.

The method for preparing a gallium oxide semiconductor structure, comprising:

1) providing a gallium oxide single-crystal wafer 1 having an implantation surface 1a, as shown in FIG. 1;

2) performing an ion implantation from the implantation surface 1a into the gallium oxide single-crystal wafer 1 in the direction of arrow, as shown in FIG. 2, such that an implantation defect layer 11 in the gallium oxide single-crystal wafer 1 is formed at a preset depth from the implantation surface 1a, and a first gallium oxide layer 12 and a second gallium oxide layer 13 are formed on opposite sides of the implantation defect layer 11;

3) bonding the implantation surface 1a to a high thermal conductivity substrate 2, as shown in FIG. 3, to obtain a first composite structure including the gallium oxide single-crystal wafer 1 and the high thermal conductivity substrate 2;

4) performing an annealing treatment on the first composite structure, as shown in FIG. 4, such that the first composite structure is peeled off along the implantation defect layer 11, thereby obtaining a second composite structure and a third composite structure, wherein the implantation defect layer 11 forms a first damaged layer 111 and a second damaged layer 112, the second composite structure includes the first damaged layer 111, the first gallium oxide layer 12 and the high thermal conductivity substrate 2, and the third composite structure includes the second damaged layer 112 and the second gallium oxide layer 13;

5) performing a surface treatment on the second composite structure to remove the first damaged layer 111, so as to obtain a gallium oxide semiconductor structure comprising the first gallium oxide layer 12 (also referred as gallium oxide single-crystal film) and the high thermal conductivity substrate 2, as shown in FIG. 5.

EXAMPLE 1

A β-type Sn-doped gallium oxide single-crystal wafer with a size of 10 mm×10 mm and a crystal orientation of (−201) was provided. H ion implantation was performed from the implantation surface, wherein the implantation energy was 30 keV, the implantation dose was $5 \times 10^{17}$ ions/cm$^2$, the implantation temperature was 30° C., and the implantation defect layer was formed at about 230 nm from the implantation surface. The implantation surface was directly bonded to a silicon oxide substrate. An annealing treatment was performed in N$_2$ atmosphere, wherein the annealing temperature was 150° C., and the annealing time was 30 min. A chemical mechanical polishing was used to remove the damaged layer to obtain a gallium oxide semiconductor structure.

EXAMPLE 2

A β-type intrinsic wafer-scale gallium oxide wafer with a crystal orientation of (100) was provided. He ion implantation was performed from the implantation surface, wherein the implantation energy was 5 keV, the implantation dose was $1 \times 10^{16}$ ions/cm$^2$, the implantation temperature was −20° C., and the implantation defect layer was formed at about 20 nm from the implantation surface. The implantation surface was bonded to a diamond substrate via anodic bonding. An annealing treatment was performed in He atmosphere, wherein the annealing temperature was 50° C., and the annealing time was 1 min. A chemical etching was used to remove the damaged layer to obtain a gallium oxide semiconductor structure.

EXAMPLE 3

An α-type iron (Fe) gallium oxide wafer-lever wafer with a crystal orientation of (001) was provided. H ion implantation and He ion implantation were performed from the implantation surface, wherein the implantation energy was 35 keV and 65 keV, the implantation dose was $1\times10^{17}$ ions/cm² 和 $2\times10^{16}$ ions/cm², the implantation temperature was 300° C., and the implantation defect layer was formed at about 230 nm from the implantation surface. The implantation surface was bonded to an aluminum nitride substrate via metal bonding. An annealing treatment was performed in $O_2$ atmosphere, wherein the annealing temperature was 700° C., and the annealing time was 8 h. A plasma etching was used to remove the damaged layer to obtain a gallium oxide semiconductor structure.

EXAMPLE 4

An α-type intrinsic gallium oxide wafer-lever wafer with a crystal orientation of (−201) was provided. H ion implantation was performed from the implantation surface, wherein the implantation energy was 1000 keV, the implantation dose was $6\times10^{17}$ ions/cm², the implantation temperature was −20° C., and the implantation defect layer was formed at about 20 μm from the implantation surface. The implantation surface was directly bonded to a silicon carbide/silicon composite substrate. An annealing treatment was performed in air, wherein the annealing temperature was 700° C., and the annealing time was 24 h. A chemical mechanical polishing was used to remove the damaged layer to obtain a gallium oxide semiconductor structure.

The foregoing description refers to preferred embodiments of the present invention, and is not intended to limit the scope of the present invention. Various changes can be made to the foregoing embodiments of the present invention. That is to say, all simple and equivalent changes and modifications made in accordance with the claims of the present invention and the content of the description fall into the protection scope of the patent of the present invention. What is not described in detail in the present invention is conventional technical content.

What is claimed is:

1. A method for preparing a gallium oxide semiconductor structure, comprising following steps:
   a step S1, providing a gallium oxide single-crystal wafer having an implantation surface, wherein the gallium oxide single-crystal wafer has a crystal orientation of (−201) or (001), the gallium oxide single-crystal wafer is Sn-doped or Fe-doped single-crystal wafer;
   a step S2, performing an ion implantation into the implantation surface of the gallium oxide single-crystal wafer, such that implanted ions reach a preset depth and an implantation defect layer is formed at the preset depth, and a first gallium oxide layer and a second gallium oxide layer are formed on opposite sides of the implantation defect layer;
   a step S3, bonding the implantation surface to a high thermal conductivity substrate to obtain a first composite structure including the gallium oxide single-crystal wafer and the high thermal conductivity substrate, wherein the implantation surface and the high thermal conductivity substrate are bonded via metal bonding or anodic bonding;
   a step S4, performing an annealing treatment on the first composite structure such that the gallium oxide single-crystal wafer in the first composite structure is peeled off along the implantation defect layer, thereby obtaining a second composite structure and a third composite structure, wherein the implantation defect layer forms a first damaged layer and a second damaged layer, the second composite structure includes the first damaged layer, the first gallium oxide layer and the high thermal conductivity substrate, and the third composite structure includes the second damaged layer and the second gallium oxide layer;
   a step S5, performing a surface treatment on the second composite structure to remove the first damaged layer, so as to obtain the gallium oxide semiconductor structure comprising the first gallium oxide layer and the high thermal conductivity substrate.

2. The method according to claim 1, wherein the gallium oxide single-crystal wafer is α-type gallium oxide single-crystal wafer or β-type gallium oxide single-crystal wafer.

3. The method according to claim 1, wherein, in the step S2, H ions and/or He ions are implanted from the implantation surface.

4. The method according to claim 3, wherein the preset depth ranges from approximately 20 nm to 20 μm.

5. The method according to claim 3, wherein the energy of the ion implantation ranges from approximately 5 keV to 1000 keV, the dose ranges from approximately $1\times10^{16}$ ions/cm² to $6\times10^{17}$ ions/cm², a"d the temperature ranges from approximately −20° C. to 300° C.

6. The method according to claim 1, wherein the high thermal conductivity substrate is a substrate or a composite substrate of at least two substrates selected from the group consisting of a silicon substrate, a silicon oxide substrate, a diamond substrate, an aluminum nitride substrate, and a silicon carbide substrate.

7. The method according to claim 1, wherein, in the step S4, the annealing treatment is carried out in a vacuum environment or in a protective atmosphere formed by at least one of nitrogen, oxygen and inert gas, the annealing temperature ranges from approximately 50° C. to 700° C., and the annealing time ranges from approximately 1 min to 24 h.

8. The method according to claim 1, wherein, in the step S5, the surface treatment is at least one treatment selected from the group consisting of chemical mechanical polishing, chemical etching, plasma etching, and low energy ion sputtering.

9. The method according to claim 1, wherein the method further comprises performing a second surface treatment on the third composite structure to remove the second damaged layer.

10. A gallium oxide semiconductor structure, wherein the gallium oxide semiconductor structure is obtained according to the method of claim 1.

* * * * *